(12) United States Patent
Landeck, Jr.

(10) Patent No.: US 9,687,939 B2
(45) Date of Patent: Jun. 27, 2017

(54) APPARATUS FOR MANUFACTURING A HYDROGEN 21 LINE PRECISION MEASURING DEVICE

(71) Applicant: Carl F. Landeck, Jr., Wayne, PA (US)

(72) Inventor: Carl F. Landeck, Jr., Wayne, PA (US)

( * ) Notice: Subject to any disclaimer, the term of this patent is extended or adjusted under 35 U.S.C. 154(b) by 0 days.

(21) Appl. No.: 13/815,573

(22) Filed: Mar. 11, 2013

(65) Prior Publication Data

US 2014/0250705 A1 Sep. 11, 2014

(51) Int. Cl.
| | |
|---|---|
| *G01B 3/02* | (2006.01) |
| *B23K 26/36* | (2014.01) |
| *C01B 3/00* | (2006.01) |
| *C09K 11/06* | (2006.01) |
| *H01L 51/00* | (2006.01) |

(52) U.S. Cl.
CPC .............. *B23K 26/365* (2013.01); *C01B 3/00* (2013.01); *C09K 11/06* (2013.01); *G01B 3/02* (2013.01); *H01L 51/0072* (2013.01)

(58) Field of Classification Search
CPC .. B43L 7/00; B43L 7/007; G01B 3/04; G01B 1/00; G01B 3/004; G01B 3/02; B26B 29/06; B23K 26/365; C01B 3/00; C09K 11/06; H01L 51/0072
See application file for complete search history.

(56) References Cited

U.S. PATENT DOCUMENTS

| | | |
|---|---|---|
| 204,601 A | 6/1878 | Perris |
| 418,968 A | 1/1890 | Benzinger et al. |
| 975,689 A | 11/1910 | Greenwood |
| 1,235,801 A | 8/1917 | Hornig |
| 1,497,492 A | 6/1924 | Engel |
| 3,209,280 A | 9/1965 | Vessot et al. |
| 3,702,972 A | 11/1972 | Fletcher et al. |

(Continued)

OTHER PUBLICATIONS

National Institute of Standards and Testing (NIST), Physical Referecne Data, Historical context of the SI, Base Unit Definitions: Meter, Online Feb. 1998 last update Jun. 25, 2015.*

(Continued)

*Primary Examiner* — Michael Zarroli
(74) *Attorney, Agent, or Firm* — Joseph E. Maenner; Maenner & Associates, LLC

(57) ABSTRACT

Apparatus for manufacturing a hydrogen 21 line precision measuring device, comprising: a hydrogen 21 line generator, which may be a hydrogen maser, which generates an emission spectrum comprising a spectral line at substantially 1420.40575177 MHz and communicates the spectral line to a frequency counter; which is adapted to receive the spectral line, measures frequency of the spectral line, and communicates an indication of the measured frequency to a computer, which receives the indicated frequency, calculates wavelength of the indicated frequency and communicates control signals to a laser or other marking device to scribe markings on a measuring device substrate at one or more intervals of the calculated wavelength and subdivisions thereof, resulting in the measuring device substrate having a plurality of scribed markings, each pair of the scribed markings at an interval of substantially the calculated wavelength and each of the subdivisions thereof equaling a portion of the calculated wavelength.

6 Claims, 2 Drawing Sheets

(56) References Cited

U.S. PATENT DOCUMENTS

Figure 1:
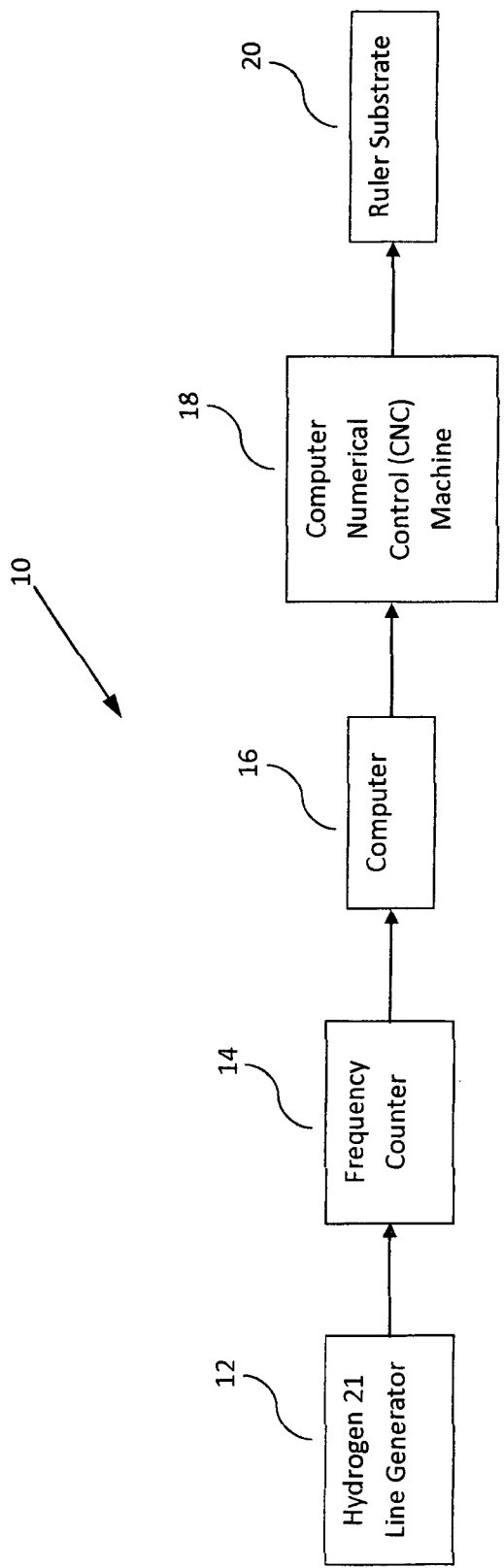

| | | |
|---|---|---|
| 4,123,727 A | 10/1978 | Peters |
| 4,290,030 A | 9/1981 | Wang |
| 4,706,043 A | 11/1987 | Stein et al. |
| 5,647,135 A | 7/1997 | Fuentes et al. |
| 5,746,001 A | 5/1998 | Fisher |
| 5,771,598 A | 6/1998 | Lassberg |
| 5,838,206 A | 11/1998 | Busca et al. |
| 5,881,469 A | 3/1999 | Monck |
| 5,896,671 A | 4/1999 | Yu |
| 6,145,210 A | 11/2000 | Walczynski |
| 6,158,135 A | 12/2000 | Rank |
| 6,243,959 B1 | 6/2001 | Monck |
| 6,255,647 B1 | 7/2001 | Vanier et al. |
| 6,434,844 B1 | 8/2002 | Rank |
| 6,813,841 B1 | 11/2004 | Ramsey |
| 7,076,881 B1 | 7/2006 | Perry |
| 7,100,295 B1 | 9/2006 | Chang |
| 7,631,437 B2 | 12/2009 | Sanderson |
| 7,652,283 B2* | 1/2010 | Inoue ................. C07F 15/0033 257/103 |
| 7,774,948 B1 | 8/2010 | Bareis |
| 8,021,158 B2 | 9/2011 | Eras et al. |
| 9,324,950 B2* | 4/2016 | Kawamura ......... H01L 51/0061 |
| 9,354,485 B2* | 5/2016 | Fermann ................... G02F 1/39 |
| 2012/0126205 A1* | 5/2012 | Kawamura ......... H01L 51/0055 257/40 |

OTHER PUBLICATIONS http://www.haystack.mit.edu/edu/pcr/Data/pdf/Hydrogen%2021-cm%20Emission%line-final.pdf; The 21-cm Line: The Hydrogen 21-cm Emission Line; Demystifying Scientific Data: RET 2006, Rev 2.*

* cited by examiner

APPARATUS FOR MANUFACTURING A HYDROGEN 21 LINE PRECISION MEASURING DEVICE

BACKGROUND OF THE INVENTION

Field of the Invention

The present invention relates generally to measuring devices and more particularly to apparatus for manufacturing Hydrogen 21 Line precision rulers.

Background Art

Throughout time, a variety of measurement systems have been used. Different systems of measurement were quite common in earlier times. In trade, standardization of weights and measures throughout history has played a key role in the advancement of civilizations, trade, commerce, and the economies of the world.

Practical use of units of measurement and accompanying standards has been critical to the development of humankind. A unit of measurement is a standardized quantity of a physical property, used as a factor to express occurring quantities of that property. More specifically, a unit of measurement is a specified magnitude of a physical quantity, often defined and adopted by convention and/or law, which is used as a standard of measurement for physical properties of phenomena, bodies, and substances that can be quantified by measurement.

Units of measurement were among the earliest tools invented by humans. Historically, many of the systems of measurement which had been in use were to some degree based on the dimensions of the human body. As a result, units of measure could vary not only from location to location, but from person to person.

Primitive societies needed rudimentary measures for many tasks: constructing dwellings of an appropriate size and shape, fashioning clothing, or bartering food or raw materials. The earliest known uniform systems of weights and measures appear to have been created in the 4th and 3rd millennia BC among the ancient peoples of Mesopotamia, Egypt and the Indus Valley, and perhaps also Elam in Persia, as well.

Early Greek units of measurement varied according to location and epoch, evolved over time, and became sophisticated even in ancient times. The calibration and use of measuring devices advanced, and by about 500 BC, Athens had a central depository of official weights and measures, the Tholos, where merchants were required to test their measuring devices against official standards.

Ancient Roman units of measurement were based on the Hellenic system with Hebrew, Egyptian, and Mesopotamian influences, and were comparatively consistent and well documented. The basic unit of Roman linear measurement was the "pes" or Roman foot.

English units of measurement evolved as a combination of the Anglo-Saxon and Roman systems of units. During the Roman period, Roman Britain relied on Ancient Roman units of measurement, and during the Anglo-Saxon period, North German units of measurement formed the basis for the units of linear measurement in the British Isles.

Both the imperial and United States customary systems of measurement were derived from earlier English systems used in the Middle Ages, which were the result of a combination of the local Anglo-Saxon units inherited from the North German tribes and the Roman units, brought to Britain by William the Conqueror after the Norman Conquest of England in 1066.

Having this shared heritage, the imperial and United States customary systems are quite similar, but there are differences. The United States customary system is based on English systems of the 18th century, while the Imperial system was defined in 1824, after American independence. In the United States, metric units are widely used in science, military, and partially in industry, but customary units predominate in household use.

A number of metric systems of units have evolved, since the adoption of the original metric system in France in 1791, which was first developed during the French Revolution to replace the existing system of measure that had fallen into disrepute. The new system had a logical structure, in which the unit of length, the meter, was based on the dimensions of the earth and the unit of mass, the kilogram, was based on the mass of water having a volume one liter or one thousandth of a cubic meter.

The metric system differed from other systems of measurement by having prefixes such as "kilo" or "milli" as decimal multipliers of units rather than having new sets of names. Thus, one kilometer is 1000 meters, and one kilogram is 1000 grams.

The metric system was adopted by the scientific community, and became an international system of units of measurement, during the first half of the nineteenth century. In 1875 the Convention of the meter was signed, and control of the standards relating to length and mass were transferred from the French government; which previously owned the prototype meter and prototype kilogram, to a trio of intergovernment organizations.

In 1960 the metric system was overhauled and relaunched as the International System of Units, abbreviated to "SI". The current international standard metric system is the International System of Units.

Rulers, rules, line gauges, measuring devices, and the like have been known, and have typically been constructed to measure and mark lengths, in accordance with the above described systems of units of measurement, to aid in drawing straight lines, and as a straight guide for cutting and scoring with a blade. Some of these instruments incorporate multiple scales for use with different units of measurements and/or different subdivisions of the units of measurement in an attempt to consolidate different measuring systems into one device.

While the above systems of units are based on arbitrary unit values, and formalized as standards, some unit values occur naturally in science. Systems of units based on these are called natural units. Natural units are natural because the origin of their definition comes only from properties of nature and not from any human construct.

Many of the heretofore known systems of units of measurement were based on arbitrary unit values, and formalized as standards. Yet, there is still no standard universally used system of units of measurement, based upon nature.

There is a need for apparatus for manufacturing a precision measuring device, based upon properties of nature. The measurement device should be based upon a system of units of measurement based upon natural units, which are based on properties of nature, each being based upon a highly accurate, single, simple, easy to use unit of measurement that uses natural units that occur in nature. The measurement device should be capable of being simply and easily constructed, using the system of natural units of measurement as a basis.

Different rulers, rules, line gauges, measuring devices, and the like have heretofore been known. However, none of the rulers, rules, line gauges, measuring devices, and the like adequately satisfies the aforementioned needs.

- U.S. Pat. No. 7,076,881 (Perry) discloses a device for measuring and teaching students different scales of measure, and aiding in the taking of measurements by users of the device, having a first face marked in feet, inches, and fractions thereof, and a second face marked in metric units of measurement. The first face is marked with standard units of measure, such as feet, inches, and fractions of inches, each scale representing a different unit of measure scale, and being arranged next to a smaller scale in an order, such that the feet measurement is arranged next to the inch scale. The inch measure is also arranged to the half-inch scale, which is arranged next to the quarter inch scale. Each succeeding scale is arranged between a larger and smaller scale. The second face is marked with scales representing metric units of measurement. Each scale on the second face represents a unit of measurement one order of magnitude smaller than the preceding scale.
- U.S. Pat. No. 5,746,001 (Fisher) discloses a teaching ruler comprising a linear measurement ruler that comprises a teaching aid for instruction in fractional and decimal units of linear measure.
- U.S. Pat. No. 5,771,598 (Lassberg) discloses a measurement device with British/metric scales that includes a generally flat member having a first edge extending therealong, a first set of British scale graduations formed along the first edge and extending inwardly of the first edge for a desired distance, and a first set of metric scale graduations formed adjacent the first set of British scale graduations and spaced in parallel relationship from the first edge of the generally flat member by approximately the length of the desired distance that the first set of British scale graduations extends inwardly. The first set of British scale graduations has numerical designations arranged in a first orientation. The first set of metric scale graduations has numerical designations arranged in a similar orientation as the numerical designations of the first set of British scale graduations.
- U.S. Pat. No. 8,021,158 (Eras, et al.) discloses a multi-scaled measurement instructional apparatus in which a plurality of measurement scales are disposed on a base medium. Each of the measurement scales are longitudinally aligned, such that equal units of measure are commonly aligned among all of the measurement scales. A first measurement scale is provided in which a plurality of uniquely color-coded base units of measurement are periodically disposed on the base medium. A second measurement scale, uniformly aligned and adjacent to the first measurement scale, includes a plurality of color-coded sub-units of measurement periodically disposed on the base medium. Each set of sub-units is equal to one half of each base unit and color-coded in a color shade corresponding to the color of the base unit. An elongated element is provided to receive the base medium.
- U.S. Pat. No. 7,774,948 (Bareis) discloses a universal design straight edge, comprising a body having a top surface and a perimeter bounded by at least one edge, the top surface comprising evenly spaced apart linear rulings perpendicularly disposed to and extending from the edge, some of the linear rulings corresponding to a unit of measure, and some of said linear rulings corresponding to a fraction of the unit of measure, and numerical indicia associated with substantially all of the rulings, substantially all of the numerical indicia substantially centered about a centerline of respective linear rulings, the numerical indicia oriented in standard upright reading position with respect to the edge where the straightedge is arranged with the edge in an underlying relation with respect to the numerical indicia. The numerical indicia associated with the linear rulings corresponding to a fraction of the unit of measure may include a composite of full and fractional numerical indicia. The straightedge may also include a handle projecting generally perpendicularly from the top surface, the handle having a height substantially greater than a thickness of the body.
- U.S. Pat. Nos. 5,881,469 and 6,243,959 (Monck) disclose a measuring and instructional ruler device for use by children and persons during the instruction of linear measurement, and for use in the measuring and drawing of objects. The device is comprised of a base panel having a top surface, which has standard units of measure delineated thereon, and at least one transparent sheet having fractional increments of the same standard unit of measure delineated thereon, wherein the transparent sheet is positionable over the base panel, so that the delineated fractional increments of the standard unit of measure may be aligned with the delineated standard units of measure to demonstrate the relationship between the unit of measure and the fractional increments thereof.
- U.S. Pat. No. 6,145,210 (Walczynski) discloses an accessorized collapsible multiscale, comprising a plurality of elongate slats that are joined together along elongate edges thereof, each slat including at least one graduated scale thereon, the multiscale being collapsible by folding together adjacent slats, and the multiscale including an accessory clip, which is used to maintain a terminal position of a desired slat, with the clip angling the slat relative to a support surface therefor for ease in viewing the scale on the desired slat.
- U.S. Pat. No. 6,813,841 (Ramsey) discloses a measuring device for teaching incremental measurements to a user of the measuring device, comprising a fastener and a plurality of rulers containing graduated markings and rotatably attached to the fastener. Each ruler is positioned to horizontally align and is vertically juxtaposed to the graduated markings of consecutive rulers. In a preferred embodiment, the sets of graduated markings vary in numerical reading increment from other sets of graduated markings. Each ruler varies in color from the other rulers of the measuring device.
- U.S. Pat. No. 204,601 (Perris) discloses a printer's measuring scale. U.S. Pat. No. 975,689 (Greenwood) discloses a type scale. U.S. Pat. No. 1,235,801 (Hornig) discloses a carpenter's computing scale.
- U.S. Pat. No. 418,968 (Benzinger, et al.) discloses a combination rule which incorporates as many as thirty six different scales. The combination rule has a triangular cross section pivoted between two end pieces.
- U.S. Pat. No. 1,497,492 (Engel) discloses a multiple scale instrument formed from a substantially rectangular sheet of material having a plurality of parallel slots therein and a plurality of scales marked thereon extending along the slot edges, the scales having different characteristics.
- U.S. Pat. No. 5,647,135 (Fuentes, et al.) discloses a self-contained drafting instrument with electronically controllable scale adapted for rapid measurement of diagrams or drawings on a surface. The instrument utilizes an internal movement detection mechanism, an electronics processing system, and a display screen capable of graphical representation. The movement detection mechanism measures both orthogonal components of movement, and the display screen provides a scale that electronically scrolls as the instrument moves or by manually pressing a key on a keyboard. The drafting instrument can be constructed in a number of orientations, including a ruler, drafting triangle, protractor, or T-square.

U.S. Pat. No. 5,896,671 (Yu) discloses a universal scale and conversion tool related to a measuring device, conversion device or ruler having specifically or universally selectable scales that can be used to measure distances with a desired linear or logarithmic scale, to draw distances to a desired scale, or to divide distances into a desired number of equal parts. The ruler comprises a transparent support plate, having special graduations which are either composed of parallel, equally spaced lines or parallel logarithmically spaced straight lines, or composed of inclined angularly spaced lines. In the instance where the lines are angularly spaced, as in a ray-like structure, the ruler may be composed of rays of inclined, straight or curved lines, the inclined lines or their extensions having a common intersection, and the spacings between any two neighboring lines being equidistant, regularly increasing, or logarithmic-related distances in at least one direction. A specific scale may be selected by rotating the ruler to a certain degree of angle as is in the former cases or by moving the ruler parallel to a certain position as in the later cases.

U.S. Pat. Nos. 6,434,844 and 6,158,135 (Rank) disclose a see through engineering instrument that has markings defining sets of longitudinal reference lines along its length. The reference lines are disposed inwardly of the side edges, and define segmentation patterns distinct to each set, distinguishing lines of the respective sets from each other. Lines of respective sets are preferably interposed each between respective lines of ones of another set or sets. Line segments in a single instrument, of the like illustrated, can define discrete measurable distances of any one, up to all, of $1/16$, $1/8$, $3/16$, $1/4$, $1/2$, $3/4$, $13/16$, $7/8$ and $15/16$ inch. The instrument can include at least 4 different scales.

U.S. Pat. No. 7,100,295 (Chang) discloses a measuring device, comprising a transparent square ruler body, having a plurality of scales, a plurality of marking lines, and a plurality of counting numbers, wherein: each of the counting numbers has a corresponding numeral, which is located under the respective counting number, each for measurement in a different direction. The marking lines, which comprise both horizontal marking lines in 0.5 mm intervals and vertical marking lines in 0.5 mm intervals, have multiple intersecting points in a metric measuring system. The measuring device may be used to measure the size of a work piece in any direction and any starting point.

U.S. Pat. No. 7,631,437 (Sanderson) discloses an electronic ruler that has a generally rectangular-solid shape that defines a length, width, and thickness. A straight edge exists along the length as do distance markings in at least one unit of measurement. A user input interface 1) receives user inputs of measurement in a format corresponding to the unit of measurement, and/or 2) shows a measurement made automatically by the ruler. A plurality of visual indicators, such as fiber optics or LED's, extend along the length and light up in an amount corresponding to the user inputs or the measurement made. In this manner, basic rulers for school-aged children provide measurement capability in the absence of sufficient gradations, and also give feedback regarding correctness to stimulate learning in adolescent students. An optical array serves to transmit/receive light to automatically take the measurements upon indications from a user. A processor connects to the indicators and array for controlling lighting.

Different frequency standards that use the intrinsic properties of hydrogen atoms to serve as a precision frequency reference have heretofore been known. However, none of the frequency standards alone adequately satisfies the aforementioned needs.

U.S. Pat. No. 4,706,043 (Stein, et al.) discloses a frequency standard, using hydrogen maser, in which a compact, self-contained frequency standard uses a passive hydrogen maser to provide an accurate, repeatable, and stable standard frequency. The hydrogen dissociator and microwave cavity of the maser and circuit means coact to reduce possible frequency variations and to promote and emphasize energy transfer from hyperfine hydrogen atoms to the frequency standard for its stabilization. The dissociator is alignable to transfer its hyperfine hydrogen atoms of a selected state to a microwave cavity; and the microwave cavity is formed by dielectric surfaces which have been coated with a conductive coating in a predetermined configuration to suppress oscillation in undesirable modes. The dissociator and microwave cavity, thus, coact to present within the microwave cavity a maximum obtainable portion of hyperfine hydrogen atoms generated by the dissociator and to enhance the release of and the detection of the energy released by the hyperfine hydrogen atoms at hydrogen resonance frequency. The circuit means locks the carrier frequency generated from the standard frequency of a voltage controlled crystal oscillator at hydrogen resonance frequency rather than one of the phase modulation sidebands of the carrier, resulting in a predictable, accurate, and stable standard frequency.

U.S. Pat. No. 4,123,727 (Peters) discloses an improvement in an atomic or molecular frequency standard, more particularly, the atomic hydrogen maser, by the use of electrode structures circumferentially placed around the exterior of the atomic or molecular storage vessel and in a surface of revolution about the initial atomic hydrogen beam path. The electrodes allow maser action in maser devices of physical dimensions much smaller than those formerly possible.

U.S. Pat. No. 4,290,030 (Wang) discloses an atomic frequency standard using a free induction technique, in which a maser is externally stimulated to allow significant reduction of the size of the maser, and the stimulation is turned off and allowed to decay so that the maser output is free from the external stimulation before the signal is sensed to provide a clock frequency standard.

U.S. Pat. No. 3,702,972 (Fletcher, et al.) discloses an atomic hydrogen maser, which has automatic control of bulb temperature so as to eliminate frequency shift due to collision of atomic hydrogen with the storage bulb walls. The storage bulb volume is changed by using a flexible bulb, and the frequency of the output from the maser is measured for at least two different surface-to-volume configurations. The temperature of the bulb is maintained, so that the output frequency is independent of the surface-to-volume ratio of the bulb, and hence independent of atomic collision rate. The control process is accomplished automatically, by measuring the maser's output frequency over each half of a cycle, the bulb configuration being made to vary from minimum volume to maximum volume. An output frequency difference signal, measured during each cycle, is used to control the bulb temperature, so that when the proper temperature is attained, a zero difference in frequency between operation at minimum volume and maximum volume is obtained.

U.S. Pat. No. 6,255,647 (Vanier, et al.) discloses an atomic frequency standard, based on coherent microwave emission from an ensemble of hydrogen or alkali metal atoms at their ground state hyperfine frequency. Hydrogen or alkali metal atoms are prepared in a coherent state by means of a radiation field resonant with the atoms at their hyperfine frequency prior to their entering into the emission region. The coherent microwave radiation emission results from the phenomenon of stimulated emission of radiation in a storage bulb placed in a cavity tuned to the hyperfine frequency. Because the atoms enter the cavity already prepared in a coherent state, radiation is emitted without threshold regarding the atomic flux or the cavity quality factor. The atoms emit their energy at their natural frequency perturbed only slightly by secondary effects, such as spin exchange collisions, wall collisions and second order cavity pulling.

U.S. Pat. No. 3,209,280 (Vessot, et al.) discloses a storage cell for an atomic hydrogen maser, which has a coated surface of a reentrant configuration, which increases particle field interaction time, without the need for a larger bulb or smaller aperture.

U.S. Pat. No. 5,838,206 (Busca, et al.) discloses an active hydrogen maser atomic frequency standard, in which an atomic maser includes a circuit for effecting a shift in the frequency of a signal injected into a resonant cavity, so as to generate alternately a first and a second signal portion having, respectively, a frequency greater than and less than the natural frequency of stimulated emission, the first and second signal portions having a periodicity corresponding to a predetermined interrogation period. Circuitry of the device is responsive to a signal detected in the cavity to produce an error signal representing the difference between the amplitude of the detected signal in response to the injection of the first and second signal portions. Further circuitry adjusts the resonant frequency of the cavity in response to the error signal. A pulse generator and a mixer periodically apply both the first and second signal portions for a limited duration only during the interrogation period.

For the foregoing reasons, there is a need for apparatus for manufacturing precision a measuring device, based upon properties of nature. The measurement device should be based upon a system of units of measurement based upon natural units, which are based on properties of nature, each being based upon a highly accurate, single, simple, easy to use unit of measurement that uses natural units that occur in nature. The measurement device should be capable of being simply and easily constructed, using the system of natural units of measurement as a basis.

The measurement device and the system of natural units of measurement should each be based upon nature, use the same natural units, and should be capable of being used. It is expected that such a system of natural units of measurement and the measurement device will become a standard universally accepted system of units and a standard universally accepted measurement device, based upon the properties of nature.

The measurement device should facilitate quick, easy, highly precise and accurate measurements and/or marking of surfaces. The measurement device should be easy to use in a variety of different environments, and should be durable, light weight, inexpensive, safe to use, attractive, sturdy, long lasting, of simple construction, and capable of being used in a quick, convenient, and efficient manner.

SUMMARY

The present invention is directed to apparatus for manufacturing a precision measuring device, based upon properties of nature. The measurement device is based upon a system of units of measurement based upon natural units, which are based on properties of nature, each being based upon a highly accurate, single, simple, easy to use unit of measurement that uses natural units that occur in nature. The measurement device is capable of being simply and easily constructed, using the system of natural units of measurement as a basis.

The measurement device of the present invention and the system of natural units of measurement based upon nature, use the same natural units, and are capable of being used. It is expected that such a system of natural units of measurement and the measurement device will become a standard universally accepted system of units and a standard universally accepted measurement device, based upon the properties of nature.

The measurement device of the present invention facilitates quick, easy, highly precise and accurate measurements and/or marking of surfaces. The measurement device is easy to use in a variety of different environments, and is durable, light weight, inexpensive, safe to use, attractive, sturdy, long lasting, of simple construction, and capable of being used in a quick, convenient, and efficient manner.

Apparatus for manufacturing a precision measuring device having features of the present invention comprises: a hydrogen 21 line generator, which may be a hydrogen maser, which generates an emission spectrum comprising a spectral line at substantially 1420.40575177 MHz and communicates the spectral line to a frequency counter; the frequency counter, which is adapted to receive the spectral line, measures frequency of the spectral line, and communicates an indication of the measured frequency to a computer; the computer, which receives the indicated frequency, calculates wavelength of the indicated frequency and communicates control signals to a laser or other marking device to scribe markings on a measuring device substrate at one or more intervals of the calculated wavelength and subdivisions thereof, resulting in the hydrogen 21 line precision measuring device comprising the measuring device substrate having a plurality of scribed markings, each pair of the scribed markings at an interval of substantially the calculated wavelength and each of the subdivisions thereof equaling a portion of the calculated wavelength.

A precision measuring device having features of the present invention comprises: a measuring device substrate having a plurality of markings and subdivisions thereof, each pair of the markings at an interval of substantially a wavelength of a spectral line generated by an emission spectrum of a hydrogen 21 line, the spectral line at substantially 1420.40575177 MHz, each of the subdivisions thereof equaling a portion of the wavelength.

DRAWINGS

Figure 2:
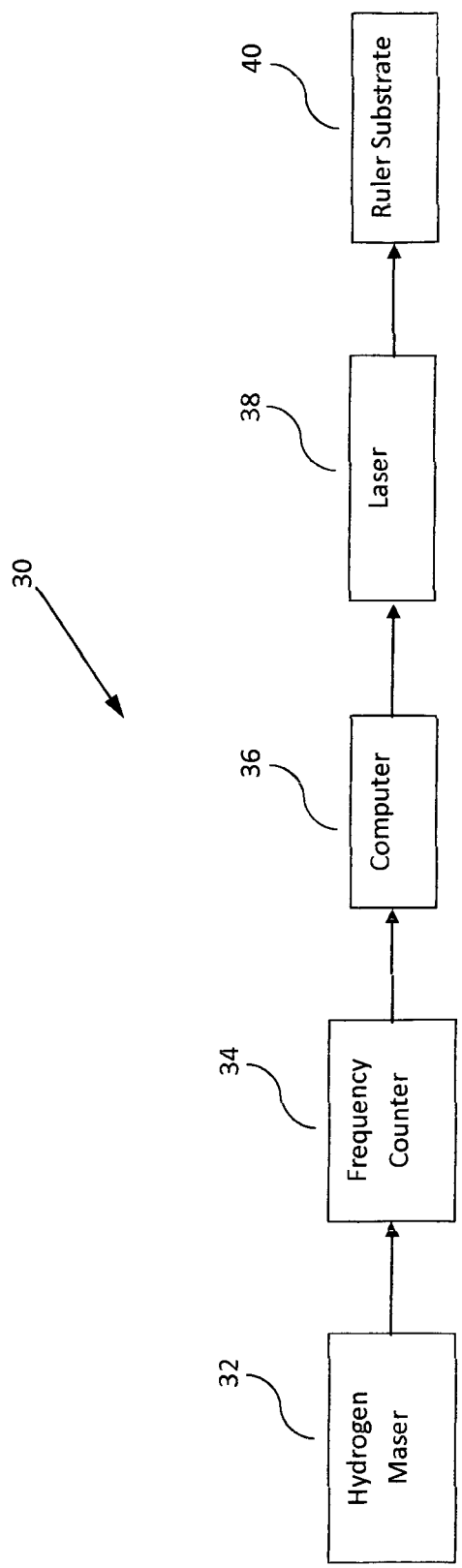

These and other features, aspects, and advantages of the present invention will become better understood with regard to the following description, appended claims, and accompanying drawing where:

FIG. 1 is a schematic representation of apparatus for manufacturing a precision measuring device, in accordance with the present invention; and FIG. 2 is a schematic representation of an alternate embodiment of apparatus for manufacturing a precision measuring device, in accordance with the present invention.

DESCRIPTION

The preferred embodiments of the present invention will be described with reference to FIGS. 1 and 2 of the drawings. Identical elements in the various figures are identified with the same reference numbers.

Elements and compounds of nature are known to emit energy, when the elements or compounds transition from one energy state to another. Energy is typically emitted in an emission spectrum of frequencies of electromagnetic radiation. Each element's emission spectrum is unique.

The emission spectrum of a chemical element or chemical compound is the spectrum of frequencies of electromagnetic radiation emitted by the element's atoms or the compound's molecules when returned to a lower energy state after excitation of the element's atoms or the compounds molecules. When electrons in an atom are excited, for example by being heated, additional energy from the heat pushes the electrons to higher energy orbitals. When the electrons fall back to lower energy orbitals, as the heat dissipates, and the electrons leave the excited state, energy is re-emitted in the form of a photon or photons. The wavelength or frequency of the photon is determined by the energy difference between the two states. These emitted photons form the element's emission spectrum.

Hydrogen emits an emission spectrum, comprising an electromagnetic radiation spectral line, often called the Hydrogen Line, 21 Centimeter Line, or HI Line, that is created by a change in energy state of neutral hydrogen atoms.

Since each element's emission spectrum is unique, spectroscopy can be used to identify the elements in matter of unknown composition. Similarly, the emission spectra of molecules can be used in chemical analysis of substances.

The Hydrogen Line, 21 Centimeter Line, or HI Line that is created by a change in energy state of neutral hydrogen atoms refers to the electromagnetic radiation is at the precise frequency of 1420.40575177 MHz, which is equivalent to the vacuum wavelength of 21.10611405413 cm in free space. This frequency or wavelength falls within the microwave radio region of the electromagnetic spectrum, and it is observed frequently in radio astronomy, since radio waves in this frequency range can penetrate the large clouds of interstellar cosmic dust that are opaque to visible light.

The periodic table is a tabular display of chemical elements, organized on the basis of their properties. Of the 92 natural elements, 25 are essential for life. Of these, there are six main elements that are the fundamental building blocks of life. These six main elements are, in order of least to most common: sulfur, phosphorous, oxygen, nitrogen, carbon, and hydrogen. Hydrogen is considered to be the most common element that is considered to be the fundamental building block of life, as we know it.

Hydrogen, which is the first element in the periodic table, has an atomic number of 1 and an average atomic weight of 1.00794 u (1.007825 u for hydrogen-1), is the lightest and most abundant chemical element, constituting roughly 75% of the Universe's chemical elemental mass. Stars in the main sequence are mainly composed of hydrogen in its plasma state.

The present invention is directed to a measurement device and a system of units of measurement based upon natural units derived from the natural element hydrogen, based on properties of nature. Selection of hydrogen as the basis for the system of units of measurements and the measuring device is based in part on the facts that: hydrogen is the lightest and most abundant chemical element, constituting roughly 75% of the Universe's chemical elemental mass; stars in the main sequence are mainly composed of hydrogen in its plasma state; the frequency or wavelength of the emission spectrum of hydrogen falls within the microwave radio region of the electromagnetic spectrum, and it is observed frequently in radio astronomy, since radio waves in this frequency range can penetrate the large clouds of interstellar cosmic dust that are opaque to visible light; a measurement device and system of natural units of measurement based upon nature, using the same natural hydrogen based units will be capable of being used.

FIG. 1 shows a schematic representation of an embodiment of the present invention, apparatus for manufacturing a Hydrogen 21 Line precision measuring device 10, comprising a Hydrogen 21 Line generator 12, the emission spectrum output of which is directed to a frequency counter 14, which measures or evaluates the frequency of the spectral line output of the emission spectrum emitted by hydrogen during a change in energy state of the hydrogen, a computer 16 for calculating or evaluating wavelength of the frequency of the spectral line output measured or evaluated by the frequency counter 14 and controlling the computer numerical control (CNC) machine 18, which scribes markings and appropriate subdivisions thereof on a measuring device substrate or ruler substrate 20. The markings and appropriate subdivisions may include indicia, insignia, indicators and/or other suitable measurement and/or marking means. Once marked with the markings and appropriate subdivisions, the marked and/or scribed measuring device substrate or the marked and/or scribed ruler substrate 20 results in a Hydrogen 21 Line precision measuring device and/or Hydrogen 21 Line precision ruler, respectively.

Elements and compounds of nature are known to emit energy, when the elements or compounds transition from one energy state to another. Energy is typically emitted in an emission spectrum of frequencies of electromagnetic radiation. Each element's emission spectrum is unique.

A hydrogen maser generates high spectral purity microwave energy, as a consequence of quantum resonance transitions of hydrogen atoms between magnetic hyperfine states. This energy is familiar to radio astronomers as the 21-cm line of atomic hydrogen.

The Hydrogen Line, 21 Centimeter Line, or HI Line that is created by a change in energy state of neutral hydrogen atoms refers to the electromagnetic radiation is at the precise frequency of 1420.40575177 MHz, which is equivalent to the vacuum wavelength of 21.10611405413 cm in free space. This frequency or wavelength falls within the microwave radio region of the electromagnetic spectrum, and it is observed frequently in radio astronomy, since radio waves in this frequency range can penetrate the large clouds of interstellar cosmic dust that are opaque to visible light.

In a preferred embodiment of the present invention, the Hydrogen 21 Line generator 12 comprises a hydrogen maser, which generates a Hydrogen 21 Line at a frequency of substantially 1420.40575177 MHz, which is equivalent to the vacuum wavelength of substantially 21.10611405413 cm in free space, although other suitable Hydrogen 21 Line generators may be used.

The hydrogen maser typically has a cavity, which, in the preferred embodiment, comprises a signal receiving loop, although another suitable antenna may be used interior or external to the cavity, to receive the Hydrogen 21 Line emission spectrum.

The emission spectrum received by the signal receiving loop or other suitable antenna of the Hydrogen 21 Line generator 12, or in the case of the preferred embodiment, received from the signal receiving loop or the other suitable antenna of the hydrogen maser, is directed to the frequency counter 14.

The frequency counter 14 measures or evaluates the frequency of the spectral line of the emission spectrum received from the signal receiving loop or the other suitable antenna of the Hydrogen 21 Line generator 12, or in the case of the preferred embodiment, the frequency counter 14 measures or evaluates the frequency of the spectral line of the emission spectrum received from the signal receiving loop or the other suitable antenna of the hydrogen maser. The frequency of the Hydrogen 21 Line measured by the frequency counter 14, which is preferably digitally encoded, is directed to the computer 16. The computer 16 calculates the wavelength of the frequency measured by the frequency counter 14 and instructs the computer numerical control (CNC) machine 18 to scribe the markings and the appropriate subdivisions thereof on the measuring device substrate or the ruler substrate 20.

A plurality of markings are scribed onto the measuring device substrate or the ruler substrate 20, each pair of the plurality of markings being equal to the wavelength of the frequency of the Hydrogen 21 Line measured by the frequency counter 14 and calculated by the computer 16 from the output of the frequency counter 14. The computer 16 also calculates subdivisions of the wavelength of the frequency of the Hydrogen 21 Line measured by the frequency counter 14 to be scribed onto the measuring device substrate or the ruler substrate 20 in between the plurality of markings equal to the wavelength of the frequency of the Hydrogen 21 Line. The subdivisions are preferably scribed as decimal subdivisions of the wavelength of the frequency of the Hydrogen 21 Line measured by the frequency counter 14, although other suitable subdivisions may be used.

The computer 16 may be a distinct from the computer numerical control (CNC) machine 18 or the frequency counter 14, or the computer 16 may alternatively be integral with the computer numerical control (CNC) machine 18 or the frequency counter 14, or any combination thereof.

The measuring device substrate or the ruler substrate 20 is typically of a stable metal, preferably of platinum-iridium alloy, which is preferably ninety percent platinum and ten percent iridium by mass, although other suitable materials may be used.

The Hydrogen 21 Line generator 12, which is preferably the hydrogen maser, the frequency counter 14, the computer 16, the computer numerical control (CNC) machine 18, and the measuring device substrate or the ruler substrate 20 are each selected for their high precision, high accuracy, high stability, and minimum drift.

A laser or other suitable scribing, marking, cutting, etching, or engraving apparatus, which is preferably controlled by the computer 16, may be used alternatively to the computer numerical control (CNC) machine 18 to scribe, mark, cut, etch, and/or engrave the plurality of markings and subdivisions onto the measuring device substrate or the ruler substrate 20.

The computer 16 may be integral with the computer numerical control (CNC) machine 18 or other suitable scribing, marking, cutting, etching, or engraving apparatus and/or the frequency counter 14, a combination thereof, or separate therefrom.

The apparatus for manufacturing the Hydrogen 21 Line precision measuring device 10 should be located in a vibration free, clean, temperature controlled environment to maximize accuracy and precision of the measuring device or the ruler being manufactured.

The measuring device or the ruler manufactured by the Hydrogen 21 Line precision measuring device 10, then, typically comprises a plurality of markings scribed onto the measuring device substrate or the ruler substrate 20, each pair of the plurality of markings being equal to the wavelength of the frequency of the Hydrogen 21 Line measured by the frequency counter 14 and calculated by the computer 16 from the output of the frequency counter 14. The measuring device or the ruler manufactured by the Hydrogen 21 Line precision measuring device 10, then, typically also comprises subdivisions of the wavelength of the frequency of the Hydrogen 21 Line measured by the frequency counter 14 scribed onto the measuring device substrate or the ruler substrate 20 in between the plurality of markings equal to the wavelength of the frequency of the Hydrogen 21 Line. The subdivisions are preferably scribed as decimal subdivisions of the wavelength of the frequency of the Hydrogen 21 Line measured by the frequency counter 14, although other suitable subdivisions may be used.

Alternate embodiments of the present invention may be derived, using the schematic representation of the apparatus for manufacturing a precision measuring device, merely by substituting an alternate emission spectrum generator for the hydrogen maser, which may be used to generate the Hydrogen 21 Line.

Other alternate embodiments of the present invention may be derived, using the schematic representation of the apparatus for manufacturing a precision measuring device, in accordance with the present invention, similar to the embodiment shown in FIG. 1, merely by substituting an alternate emission spectrum generator for the Hydrogen 21 Line generator, the alternate emission spectrum generator being used to generate an emission spectrum from one or more alternate natural elements, since other natural elements may alternatively be used to generate alternate emission spectra.

FIG. 2 shows a schematic representation of an alternate embodiment of an apparatus for manufacturing a Hydrogen 21 Line precision measuring device 30, which is substantially the same as the apparatus for manufacturing a Hydrogen 21 Line precision measuring device 10, except that the apparatus for manufacturing a Hydrogen 21 Line precision measuring device 30 has a hydrogen maser 32 and a laser 38.

The apparatus for manufacturing a Hydrogen 21 Line precision measuring device 30, comprises the hydrogen maser 32, the emission spectrum output of which is directed to a frequency counter 34, which measures or evaluates the frequency of the spectral line output of the emission spectrum emitted by hydrogen during a change in energy state of the hydrogen, a computer 36 for calculating or evaluating wavelength of the frequency of the spectral line output measured or evaluated by the frequency counter 34 and the laser 38, which scribes, marks, cuts, etches, or engraves markings and appropriate subdivisions thereof on a measuring device substrate or ruler substrate 40. The computer 36 is also used to control the laser 38.

The laser 38 may be a laser engraver or other suitable laser scribing, marking, cutting, etching, or engraving apparatus. The computer 36 may be integral with the laser 38 or other suitable laser scribing, marking, cutting, etching, or engraving apparatus, the frequency counter 34, combination thereof, or separate therefrom.

The apparatus for manufacturing the Hydrogen 21 Line precision measuring device 30 should also be located in a vibration free, clean, temperature controlled environment to maximize accuracy and precision of the measuring device or the ruler being manufactured.

Although the present invention has been described in considerable detail with reference to certain preferred versions thereof, other versions are possible. Therefore, the spirit and scope of the appended claims should not be limited to the description of the preferred versions contained herein.

What is claimed is:

1. Apparatus for manufacturing a hydrogen 21 line precision measuring device, comprising:
   a hydrogen 21 line generator, which generates an emission spectrum comprising a spectral line at substantially 1420.40575177 MHz and communicates said spectral line to a frequency counter;
   said frequency counter, which is adapted to receive said spectral line, measures frequency of said spectral line generated by said hydrogen 21 line generator, and communicates an indication of said measured frequency to a computer; said computer, which receives said indicated frequency measured by said frequency counter, calculates wavelength of said indicated frequency and communicates control signals to a computer controlled scribing apparatus; said computer controlled scribing apparatus, which is adapted to receive said control signals, scribes markings on a measuring device substrate at one or more intervals of said calculated wavelength and subdivisions thereof, resulting in said hydrogen 21 line precision measuring device comprising said measuring device substrate having a plurality of scribed markings, each pair of said scribed markings at an interval of substantially said calculated wavelength and each of said subdivisions thereof equaling a portion of said calculated wavelength,
   wherein said measuring device substrate is of a platinum-iridium alloy of substantially ninety percent platinum and substantially ten percent iridium.

2. The apparatus for manufacturing the hydrogen 21 line precision measuring device according to claim 1, wherein: said computer controlled scribing apparatus comprises a laser.

3. The apparatus for manufacturing the hydrogen 21 line precision measuring device according to claim 1, wherein: said computer controlled scribing apparatus comprises a computer numerical control (CNC) machine.

4. The apparatus for manufacturing the hydrogen 21 line precision measuring device according to claim 1, wherein: said hydrogen 21 line precision measuring device comprises a hydrogen 21 line precision ruler.

5. The apparatus for manufacturing the hydrogen 21 line precision measuring device according to claim 2, wherein: said hydrogen 21 line precision measuring device comprises a hydrogen 21 line precision ruler.

6. The apparatus for manufacturing the hydrogen 21 line precision measuring device according to claim 3, wherein: said hydrogen 21 line precision measuring device comprises a hydrogen 21 line precision ruler.

* * * * *